United States Patent [19]

Ashmore, Jr.

[11] Patent Number: 5,491,660
[45] Date of Patent: Feb. 13, 1996

[54] ON-CHIP OPERATION CONTROL FOR MEMORIES

[75] Inventor: Benjamin H. Ashmore, Jr., Houston, Tex.

[73] Assignee: Texas Instruments Incorporated, Dallas, Tex.

[21] Appl. No.: 341,733

[22] Filed: Nov. 18, 1994

[51] Int. Cl.$^6$ ........................................ G11C 7/00
[52] U.S. Cl. .................... 365/230.02; 365/185.12; 365/236; 365/189.02; 365/239; 365/240
[58] Field of Search .................... 365/185, 218, 365/201, 189.01, 230.01; 371/21.1

[56] References Cited

U.S. PATENT DOCUMENTS

| | | | |
|---|---|---|---|
| 4,780,855 | 10/1988 | Iida et al. | 365/185 |
| 5,327,383 | 7/1994 | Merchant et al. | 365/185 |
| 5,347,489 | 9/1994 | Merchant et al. | 365/185 |
| 5,359,570 | 10/1994 | Hsu et al. | 365/230.01 |

Primary Examiner—David C. Nelms
Assistant Examiner—Vu A. Le
Attorney, Agent, or Firm—Theodore D. Lindgren; Leo N. Heiting; Richard L. Donaldson

[57] ABSTRACT

The memory control this invention includes a microprogram-read-only-memory (CROM) containing micro instructions for operation of an integrated-circuit memory, a program counter multiplexer (PCM) to select instructions from the control-read-only-memory, a micro-instruction decoder (MID), a test input multiplexer (TIM) to test control signals, an optional status output register (SOR) to generate control signals, and an optional subroutine stack (SS) to allow function calls. Complex program, erase, and compaction instructions for the integrated-circuit memory are implemented using a relatively small number of control-read-only-memory locations and using a relatively small surface area on the memory chip. Control instructions are easily modified to compensate for process and structure enhancements are made during the production lifetime of an integrated-circuit memory.

14 Claims, 2 Drawing Sheets

ON-CHIP OPERATION CONTROL FOR MEMORIES

BACKGROUND OF THE INVENTION

The present invention relates to a nonvolatile, integrated-circuit memory array such as a flash erasable, electrically programmable read-only-memory (flash EPROM or flash EEPROM) array. In particular, the invention relates to on-chip control of operations such as programming, erasing and compaction of such memories.

Flash EPROMs of the type discussed herein are described in: (a) "A Single Transistor EEPROM cell and its implementation in a 512 K CMOS EEPROM", S. Mukherjee et al., IEDM 1985 (p. 616–619) and in (b) "A 90ns 100 K Erase/Program Cycle Megabit Flash Memory", V. Kynett et al., ISSCC 1989 (p. 140–141). The topic of reference (a) is also discussed in U.S. Pat. No. 4,698,787.

Early flash memories required complex commands from a separate-chip microprocessor when performing write and erase operations. For example, instead of a simple erase command from the microprocessor, the microprocessor was required to furnish such information as the length of the erase pulse and a routine to check for proper erasure. While the commands for write and erase operation could be changed to accommodate manufacturing variations among chips of the same type, those changes had to be programmed by system users, requiring additional system manufacturing time. In addition, replacement of flash memories after exceeding the maximum number or program/erase cycles was made difficult because replacement memories with different characteristics require re-programming of the separate-chip microprocessor, which is often difficult for an end-user.

As flash memory technology evolves, the demand by end users for increasing ease of installation, use and replacement has led to the development of automated control instructions for programming and erasing FLASH memories. The automated program and erase control instructions are embedded in the write state machine (WSM) architecture of such flash EPROMs. The codes for those control instructions are stored in a control-read-only-memory (CROM) in the WSM. With the automated program and erase instructions embedded in the write state machine, the external-to-chip microprocessor need only furnish a simple "erase" command. That is, it is not necessary for the external-to-chip microprocessor to furnish pulse length directions or other information necessary to perform the write and erase operations. The embedded program and erase control instructions allows the memory manufacturer to compensate to alter the program and erase control instructions to compensate for manufacturing variations.

It is not practical to form a microprocessor having all of the features of an external-to-memory-chip microprocessor on a memory chip, which generally has limited space outside of the memory array.

Prior-art implementation of embedded program and erase control instructions generally fall into two groups, random-logic implementation and programmed-logic-array-based implementation (PLA-based implementation).

The first group, random-logic implementations, generally consume a large surface area on a memory chip, such as a flash EPROM chip. Using random-logic implementation, both the program and erase/compaction instructions are generally limited to simple operations because of the required high number of logic gates needed to implement those instructions.

The second group, PLA-based implementations, also generally consume a large chip area. Typically, a separate programmed logic array is dedicated to each mode of operation when used to implement an automated instruction. This requires a minimum of four programmed logic arrays for a flash EPROM chip—one for the control operation, one for the program operation, one for the erase operation, and one for the compaction operation. While more complex instructions can be implemented using this second group rather than the first group, the state density is not high. In addition, instruction changes to compensate for manufacturing variations are generally difficult to make on existing designs.

SUMMARY OF THE INVENTION

The memory control this invention includes a microprogram read-only-memory, or control-read-only-memory (CROM), containing micro instructions, a program counter multiplexer (PCM) to select instructions from the control-read-only-memory (CROM), a micro-instruction decoder (MID), an input test input multiplexer (TIM) to test control signals, an optional status output register (SOR) to generate control signals, and an optional subroutine stack (SS) to allow function calls.

This on-chip flash EPROM control offers several advantages over previous art. One advantage is that information density in the control-read-only-memory is high. Therefore, complex program, erase, and compaction instruction are implemented using a relatively small number of control-read-only-memory locations. As a result, the required surface area on the memory chip is small.

Yet another advantage is that control instructions are easily modified. Normally, process and structure enhancements are made during the production lifetime of integrated circuit devices. It is important to be able to easily modify the embedded program/erase/compaction instructions as those process and structure enhancements occur. Using the control of this invention, those modifications are easily accomplished by simply changing the microcode contained in the control-read-only-memory.

DETAILED DESCRIPTION OF THE INVENTION

Figure 1:
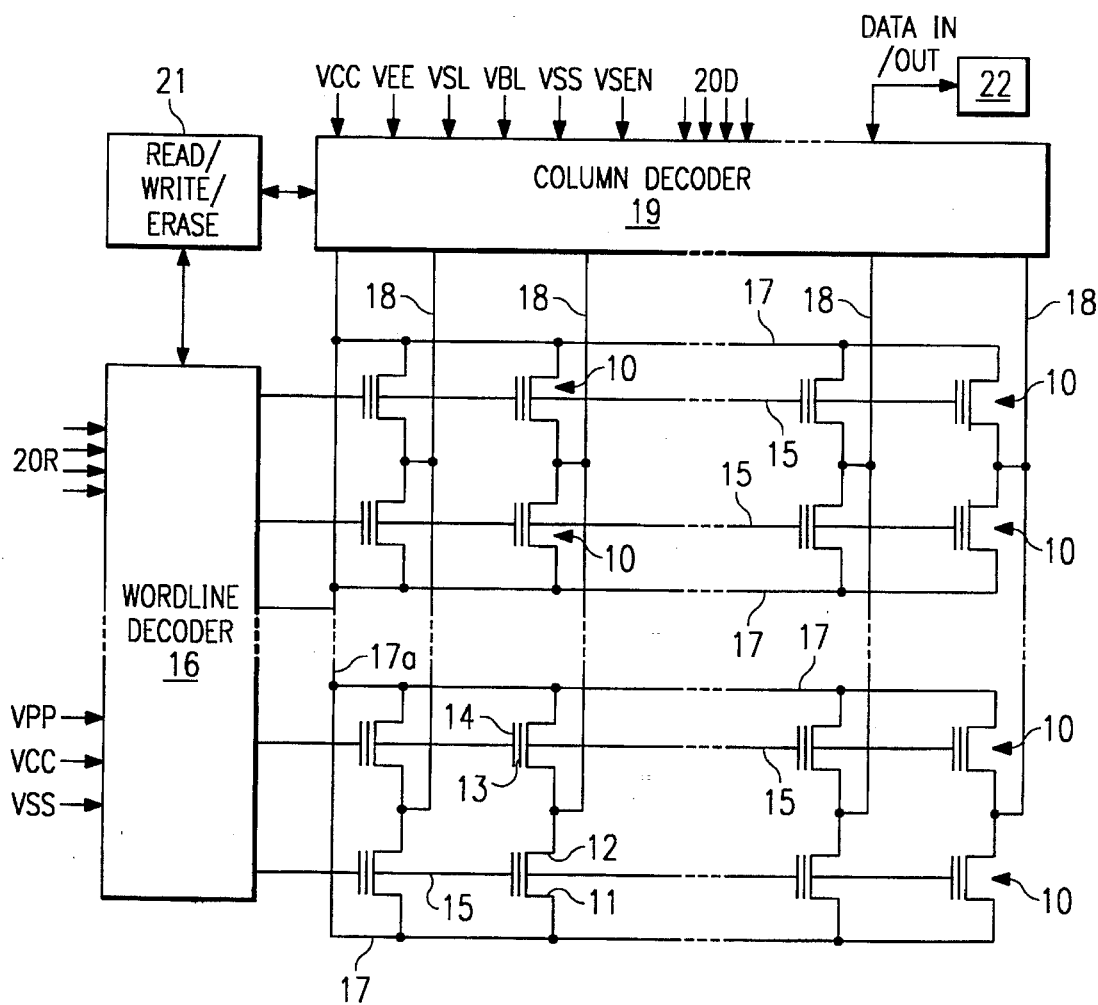
FIG. 1 is an electrical schematic diagram, in partial block form, of a memory cell array.

Referring to FIG. I, an example array of memory cells, which is an integral part of a memory chip, is shown for the purpose of illustrating use of the method and circuitry of this invention. Each cell is a floating-gate transistor 10 having a source 11, a drain 12, a floating gate 13, a control gate 14. Each of the control gates 14 in a row of cells 10 is connected to a wordline 15, and each of the wordlines 15 is connected to a wordline decoder 16. Each of the sources I 1 in a row of cells 10 is connected to a source line 17. Each of the drains 12 in a column of cells 10 is connected to a drain-column line 18. Each of the source lines 17 is connected by a common-column line 17a to a column decoder 19 and each of the drain-column lines 18 is connected to the column decoder 19.

In the read mode, the wordline decoder 16 functions, in response to wordline address signals on lines 20R and to signals from Read/Write/Erase control circuit 21 (or microprocessor 21), to apply a preselected positive voltage VCC (approx. +5 V) to the selected wordline 15, and to apply a low voltage (ground or VSS) to deselected wordlines 15. The column decoder 19 functions to apply a preselected positive voltage VSEN (approx. +1 V) to at least the selected drain-column line 18 and to apply a low voltage (0 V) to the source line 17. The column decoder 19 also functions, in response to signals on address lines 20D, to connect the selected drain-column line 18 of the selected cell 10 to the DATA IN/OUT terminal 22. The conductive or nonconductive state of the cell 10 connected to the selected drain-column line 18 and the selected wordline 15 is detected by a sense amplifier (not shown) connected to the DATA IN/OUT terminal 22.

During a flash-erase mode, the column decoder 19 functions to leave all drain-column lines 18 floating (connected to a high impedance such as field-effect transistor biased in "OFF" condition). The wordline decoder 16 functions to connect all the wordlines 15 to VSS, which may be ground or 0 V. The column decoder 19 also functions to apply a positive voltage VEE (approx. +10 V to +15 V) to all the source lines 17. These erasing voltages create sufficient field strength across the gate oxide region to generate a Fowler-Nordheim tunnel current that transfers charge from the floating gate 13, erasing the memory cell 10. Since the potential on the wordline 15 is at reference voltage VSS, the cell 10 remains in the nonconducting state during erase. Over-erased cells are corrected by one of several compaction procedures.

In a write or program mode, the wordline decoder 16 may function, in response to wordline address signals on lines 20R and to signals from Read/Write/Erase control circuit 21, (or microprocessor 21) to place a preselected first programming voltage VPP (approx. +12 V) on a selected wordline 15, including a selected control-gate 14. Column decoder 19 also functions to place a second programming voltage VBL (approx. +5 to +10 V) on a selected drain-column line 18 and, therefore, the drain 12 of selected cell 10. Source lines 17 are connected to reference potential VSS, which may be ground. All of the deselected drain-column lines 18 are connected to reference potential VSS or are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2 V to −6 V with respect to the channel region (with the control gate 14 at 0 V). For memory cells 10 fabricated in accordance with the example embodiment, the coupling coefficient between a control gate 14/wordline 15 and a floating gate 13 is approximately 0.6. Therefore, a programming voltage VPP of 12 V, for example, on a selected wordline 15, including the selected control gate 14, places a voltage of approximately +7.2 V on the selected floating gate 13. The voltage difference between the floating gate 13 (at approx. +7.2 V) and the grounded (approx. 0 v) source line 17 is insufficient to cause a Fowler-Nordheim tunneling current across the gate oxide between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive with +5 V on its control gate, a state which is read as a "zero" bit. Non-programmed cells 10 have source-drain paths under the floating gate 13 that are conductive with +5 V on their control gates, and those cells 10 are read as "one" bits.

For convenience, a table of read, write and erase voltages is given in TABLE I below:

TABLE I

| | Read | Flash Erase | Program |
|---|---|---|---|
| Selected Wordline | 5 V | 0 V (All) | +12 V |
| Deselected Wordlines | 0 V | — | 0 V |
| Selected Drain Line | 1.0 V | Float (All) | +5 V to +10 V |
| Deselected Drain Lines | 0 V/Float | — | Float |
| Source Lines | 0 V | +10 V or +15 V | 0 V |

Figure 2:
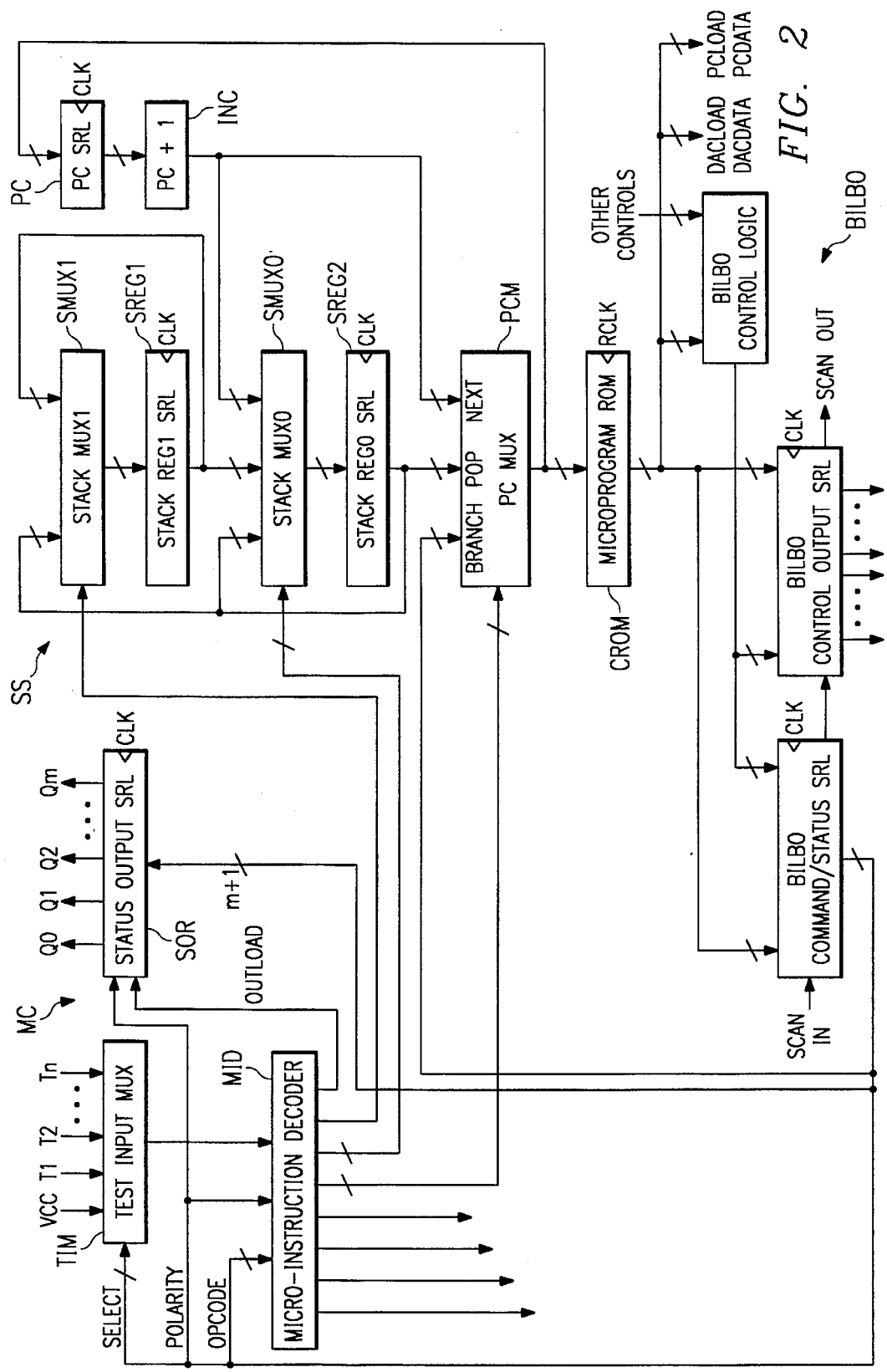
FIG. 2 is a circuit, in block form, illustrating an embodiment of the control method of this invention.

The device of this invention is a part of Read/Write/Erase control circuit 2 1 of FIG. 1. FIG. 2 illustrates an embodiment of this invention in block diagram form. The circuit of FIG. 2 includes the following:

A) A Microprogram-Read-Only-Memory or Control-Read-Only-Memory CROM. In this example implementation, the microprogram memory CROM is a 256 by 75 array including rows and columns of mask-programmable memory cells. The Microprogram ROM CROM may be a nonvolatile array of erasable cells or other type nonvolatile array. The methods for construction of such arrays as well as their operation is well-known in this art. In this example, sixteen bits of each word are used for microcontrol, with the remaining bits used to control internal circuit operation of the flash EPROM of FIG. 1.

B) A Microsequencer Circuit MC. In this example implementation, the Microsequencer Circuit MC including a Program Counter PC; an Incrementer INC; a Program Counter Multiplexer PCM; a Micro-Instruction Decoder MID; a Test Input Multiplexer TIM; a Subroutine Stack SS including a first Stack Multiplexer SMUX1, a first Stack Register SREG1, a second Stack Multiplexer SMUX0, and a second Stack Register SREG0; and an Status Output Register SOR.

The Program Counter PC is reset to zero at the start of each embedded control operation. The Program Counter PC contains the address of the currently addressed microcode word. The construction and operation of such program counters is well-known in this art.

The incrementer INC takes the current Program Counter PC value and, from it, generates the next microcode address. The construction and operation of such "plus-one" devices is well-known in this art.

The Program Counter Multiplexer PCM of this example is a three-to-one multiplexer. Under the control of the Micro-Instruction Decoder MID (described in the next paragraph) the Program Counter Multiplexer PCM selects either a field from the current microcode word, the current value of second stack register SREG0, or the incrementer INC as the address into the microprogram memory CROM.

The Micro-Instruction Decoder MID decodes the operation code field of the microcode word from the Test Input Multiplexer TIM and other inputs and controls the input state of Program Counter Multiplexer PCM, the first Stack Multiplexer SMUX1, the second Stack Multiplexer SMUX0, and the Status Output Register SOR. The construction and operation of such decoders is well-known in this art.

The Test Input Multiplexer TIM selects one of n inputs (31 inputs, for example) to test for condition branch instructions. The construction and operation of such multiplexers is well-known in this art.

The Subroutine Stack SS consists of first Stack Multiplexer SMUX1, first Stack Register SREG1, second Stack Multiplexer SMUX0 and second Stack Register SREG0. The Subroutine Stack SS allows nesting of subroutine calls two deep. The construction and operation of such multiplexers and stack, or shift, registers is well-known in this art.

The Status Output Register SOR is, for example, a thirteen bit register whose bits can be set or cleared. The construction and operation of such registers is well-known in this art.

The inputs T1–Tn to the Test Input Multiplexer TIM are test condition inputs from other logic circuitry on the chip, the other logic circuitry being triggered by input from an off-chip microprocessor. The test condition inputs T1–Tn include a reset input, a programmable-timer time-out input, a programmable-counter end-of-count input, a row-address end-of-count input, a column-address end-of-count input, a sector/block end-of-count input, a high-array-source voltage detection input, a data-comparison approval input, a write-request input, a block-protection input, a low-power program-mode input, special-mode input, a checker-board program-mode input, a full-chip-mode-only input, a one-byte-mode-only mode input, a precondition-word-program mode input, a precondition-word-program-verify mode input, an erase-mode input, an erase-verify-mode input, a compaction-mode input, a compaction-verify-mode input, program-option-for-precondition mode input, a number of select-compaction-option mode inputs, a select-autocycle mode input, and a redundant-replacement input for the auto-cycle mode.

In the example of FIG. 2 the outputs of the microprogram memory CROM are connected to special Built-In-Logic-Block-Observation BILBO registers that furnish clock signals and check to see that the information in the microprogram memory is correct. An example of such BILBO circuitry is described in U.S. patent application Ser. No. 08/315,526, filed Sep. 30, 1994, also assigned to Texas Instruments Incorporated. The outputs of the BILBO registers include, for example, outputs indicating activation or deactivation of the high-voltage circuitry on the chip, instruction of the address counter and decoder circuitry, and activation of the data comparison circuitry.

The outputs from Status Output Register SOR include, for example, outputs for microsequencer status (done or not), for an overlay block, for program/erase failure, for stop clock oscillator, for select column, for increment sector counter, for timer override, for increment counter, for set-signature test mode, for override pulse timer by external clock, for force row-redundant match, for force column-redundant match, for select bit or byte correction, and for access to overlay block.

This invention is useful for any device that requires embedded control instructions for operation.

While this invention has been described with respect to an illustrative embodiment, this description is not intended to be construed in a limiting sense. In particular, this invention is applicable to use with power supplies having voltage outputs less than three-volt example used herein. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

I claim:

1. A method for controlling operation of a memory array formed on a single integrated-circuit chip in response to microcodes from an external source, said method comprising:

forming a control-read-only-memory on said chip;

programming instructions for performing said operation in said control-read-only-memory; and forming a microsequencer on said chip to perform, in response to said microcodes from said external source, said operation of said memory array according to said instructions programmed in said control-read-only-memory;

wherein said microsequencer includes a test multiplexer for receiving microcodes from said external source and for coupling a first signal to an instruction decoder; said instruction decoder also receiving an operation code from said control-read-only-memory, said instruction decoder controlling a subroutine stack; a program counter multiplexer for receiving said operation code, for receiving a second signal from said subroutine stack, and for receiving a third signal from an incrementer, said program counter multiplexer furnishing a fourth signal to said control-read-only-memory; and said incrementer taking said fourth signal from said program counter multiplexer and, from said fourth signal, generating said third signal as a next microcode address.

2. The method of claim 1, wherein said operation is writing data into said memory array.

3. The method of claim 1, wherein said operation is erasing data from said memory array.

4. The method of claim 1, wherein said memory array is a nonvolatile memory array.

5. The method of claim 1, wherein said control-read-only memory array is a mask-programmable nonvolatile memory array.

6. The method of claim 1, said subroutine stack further including a first subroutine multiplexer furnishing a fifth signal to a first shift register, said first shift register furnishing a sixth signal to a second subroutine multiplexer, said second subroutine multiplexer furnishing a seventh signal to a second shift register, said second shift register furnishing said second signal to said program counter multiplexer and to said first and second subroutine multiplexers.

7. A circuit for controlling operation of a memory array formed on a single integrated-circuit chip in response to microcodes from an external source, said circuit comprising:

a control-read-only-memory on said chip, said control-read-only-memory storing instructions for performing said operation; and a microsequencer on said chip to perform, in response to said microcodes from said external source, said operation of said memory array according to said instructions programmed in said control-read-only-memory;

wherein said microsequencer includes a test multiplexer for receiving microcodes from said external source and for coupling a first signal to an instruction decoder; said instruction decoder also receiving an operation code from said control-read-only-memory, said instruction decoder controlling a subroutine stack; a program-counter multiplexer for receiving a second signal from said subroutine stack and a third signal from an incrementer, said program-counter multiplexer furnishing a fourth signal to said control-read-only-memory; said incrementer taking said fourth signal and generating said third signal as a next microcode address.

8. The circuit of claim 7, wherein said operation is writing data into said memory array.

9. The circuit of claim 7, wherein said operation is erasing data from said memory array.

10. The circuit of claim 7, wherein said memory array is a nonvolatile memory array.

11. The circuit of claim 7, wherein said control-read-only memory array is a mask-programmable nonvolatile memory array.

12. The circuit of claim 7, said subroutine stack further including a first subroutine multiplexer furnishing a fifth signal to a first shift register, said first shift register furnishing a sixth signal to a second subroutine multiplexer, said second subroutine multiplexer furnishing a seventh signal to a second shift register, said second shift register furnishing said second signal to said program-counter multiplexer and to said first and second subroutine multiplexers.

13. Control means for controlling operation of a memory array formed on a single integrated-circuit chip in response to microcodes from an external source, said means comprising:

control-read-only-memory means on said chip;

programming instructions means on said chip for performing said operation in said control-read-only-memory means; and microsequencer means on said chip to perform, in response to said microcodes from said external source, said operation of said memory array according to said instructions programmed in said control-read-only-memory means;

wherein said microsequencer means includes test-multiplexer means for receiving microcodes from said external source and for coupling a first signal to instruction-decoder means; said instruction-decoder, means also receiving an operation code from said control-read-only-memory means, said instruction-decoder means controlling subroutine-stack means: program-counter-multiplexer means for receiving said operation code, for receiving a second signal from said subroutine-stack means, and for receiving a third signal from incrementer-means, said program-counter-multiplexer means furnishing a fourth signal to said control-read-only-memory means; and said incrementer means taking said fourth signal from said program-counter-multiplexer means and, from said fourth signal, generating said third signal as a next microcode address.

14. The control means of claim 13, said subroutine-stack means further including first-subroutine-multiplexer means furnishing a fifth signal to first-shift-register means, said first-shift-register means furnishing a sixth signal to second-subroutine-multiplexer means, said second-subroutine-multiplexer means furnishing a seventh signal to second-shift-register means, said second-shift-register means furnishing said second signal to said program-counter-multiplexer means and to said first- and second-subroutine-multiplexer means.

* * * * *